(12) United States Patent
Chen

(10) Patent No.: US 7,771,165 B2
(45) Date of Patent: Aug. 10, 2010

(54) FAN DEVICE

(75) Inventor: Jui-Lin Chen, Taipei (TW)

(73) Assignee: Inventec Corporation, Taipei (TW)

( * ) Notice: Subject to any disclaimer, the term of this patent is extended or adjusted under 35 U.S.C. 154(b) by 940 days.

(21) Appl. No.: 11/599,017

(22) Filed: Nov. 13, 2006

(65) Prior Publication Data
US 2008/0019848 A1    Jan. 24, 2008

(30) Foreign Application Priority Data
Jul. 24, 2006    (TW) ............................... 95126936 A

(51) Int. Cl.
*F01D 25/22* (2006.01)
(52) U.S. Cl. ..................... 415/213.1; 361/695; 174/252
(58) Field of Classification Search .................. 415/60, 415/213.1, 220; 417/423.14; 361/695; 174/252
See application file for complete search history.

(56) References Cited
U.S. PATENT DOCUMENTS
6,373,698 B1 *    4/2002  Christensen ................ 361/695

2004/0202541 A1 *   10/2004  Stewart et al. ........... 415/213.1

OTHER PUBLICATIONS

Inventec IESC, Enterprise Solution, Server, Storage, Blade Server, Management Software Brochure (59 pages), Taipei International Computer Expo held Jun. 6-10, 2006.

* cited by examiner

*Primary Examiner*—Edward Look
*Assistant Examiner*—Aaron R Eastman
(74) *Attorney, Agent, or Firm*—Peter F. Corless; Steven M. Jensen; Edwards Angell Palmer & Dodge LLP

(57) ABSTRACT

A fan device includes a fan body having a connecting portion and two corresponding side portions, wherein each side portion is provided with at least a corner edge consisting of an aperture, a fan frame, a frame connecting end connecting with the connecting portion, a side wall for dividing the fan body, and a wrench having a wrench connecting end and an exerting end, wherein the wrench connecting end has two protrusion portions disposed on both side thereof. When installing the fan body in the fan frame, the exerting end is used to exert force to turn the wrench so that is abuts against a side wall thereof, thereby exerting force on the side wall and the exerting end to detach the connecting portion from the wrench connecting end.

7 Claims, 6 Drawing Sheets

FAN DEVICE

FIELD OF THE INVENTION

The present invention relates to fan devices, and more particularly, to a fan device that is laborsaving and easy to disassemble.

BACKGROUND OF THE INVENTION

Because the integrated circuit designs and a technique to progress continuously, the density of the integrated circuit also promotes immediately and continuously. With the application has a great deal of sever system of integrated circuit for example, in order to increase the speed of the data processing and employ the space more efficiently, the systems usually install multi-integrated circuits produce high temperature during operation in the narrow space, such as central processing unit or graphic chip and so on. In order to protect these server systems, the cabinets are placing out these server systems. High temperature rise while the integrated circuits start operating physically. The high temperature cannot spread out easy then caused the standard operation of the server systems. Generally stop ending, a heat-fan dissipating device is the method with low cost and efficiency.

FIG. 1 is a perspective view of a fan device 1 according to the prior art. The fan device 1 comprises a plurality of fans 10, a fan frame 12 and a fastening member 14. Each of the fans 10 has at least a connecting portion (not shown) used for power or signal delivery. The fan frame 12 has a plurality receiving spaces 122 for receiving the fans, a plurality of sidewalls 124 for partitioning the fans 10, and a bottom portion 126. A plurality of frame connecting ends (not shown) corresponding to the connecting portions of the fans 10 are installed on the bottom portion 126 for electrically connecting with the connecting portions and exchanging power or signals to the connecting portions. The fastening member 14 is disposed between the side wall 124 and a side portion 102 of the fan 10 for fastening the fan body 10 and the connecting portions of the fan body 10 on the frame connecting ends of the fan frame 12.

The drawback of the prior art of the fan device 1 is while the fan 10 installed in the receiving space 122 of the fan frame 12, and connect frame connecting end and connecting portion electrically, as soon as the fan 10 need to be extracted from the fan frame 12, and because the interval in between is too narrow to extract, then caused the difficulty and inconvenience of extraction.

FIG. 2 is the perspective view of another prior art of the fan device. As shown in the FIG. 2, to resolve the drawback of extractional difficulty of the prior art of the fan device, therefore to place a lifting device 202a at the upper end of the fastening member. This lifting device 202a is the exerting point to extract the fan, and because the fan body and the connecting portion are holed and fastened by the lifting device 202a, therefore, user can use the lifting device 202a to extract the fan.

Although the aforementioned technology can improve the extractional difficulty partially, however, the dimension of the exerting point is too small and also the direction of the torque almost as parallel as the lifting device 202a. For this reason, the problems still cannot be settled.

SUMMARY OF THE INVENTION

In light of the above prior-art drawbacks, a primary objective for the present invention is to provide a fan device that is easy to assemble and disassemble and easy to extract to.

As aforementioned purpose, this invention provides a fan device includes a fan body having a connecting portion and two corresponding side portions, wherein each side portion is provided with at least a corner edge consisting of an aperture, an fan frame, a frame connecting end connecting and fastening with the connecting portion, a sidewall for dividing the fan body, and a wrench having a wrench connecting end and an exerting end, wherein the wrench connecting end has two protrusion portions disposed on both sides thereof. When installing the fan body in the fan frame, the exerting end is used to exert force to turn the wrench so that is abuts against a side wall thereof, thereby exerting force on the side wall and the exerting end of detach the connecting portion from the wrench connecting end.

The fastening member is accommodating in the fan device. The fan body has two corresponding sides, wherein each side portion is provided with at least a corner edge consisting of an aperture; this fastening member is provided with a top end having a concave, this concave with respect to the fan body pivotally connect with a side of the aperture of the protrusion of the wrench is installed a hole that is parallel with the aperture. This fastening member is having a coupling portion that is vertical extended; this coupling is installed outside the corner edge of the hole. The coupling portion is provided with a hook-shaped portion can enter to the fan body; the hold-coupling portion is placing underneath the bottom end of the fastening member. This is used for holding and fastening the connecting portion of the fan body.

Compare to prior art, the structural design of the fan body the fan frame and the wrench as aforementioned, when the fan body is installing in the fan frame, the exerting end is used to exert force to turn the wrench so that is abuts against a side wall thereof, thereby exerting force on the side wall and the exerting end to detach the fan body from the fan frame.

BRIEF DESCRIPTION OF THE INVENTION

DETAILED DESCRIPTION OF THE INVENTION

The present invention is described by the following specific embodiments. Those ordinary skills in the arts can readily understand the other advantages and functions of the present invention after reading the disclosure of this specification. The present invention can also be implemented with different embodiments. Various details described in this specification can be modified base on different viewpoints and applications without departing from the scope of the present.

Figure 1:
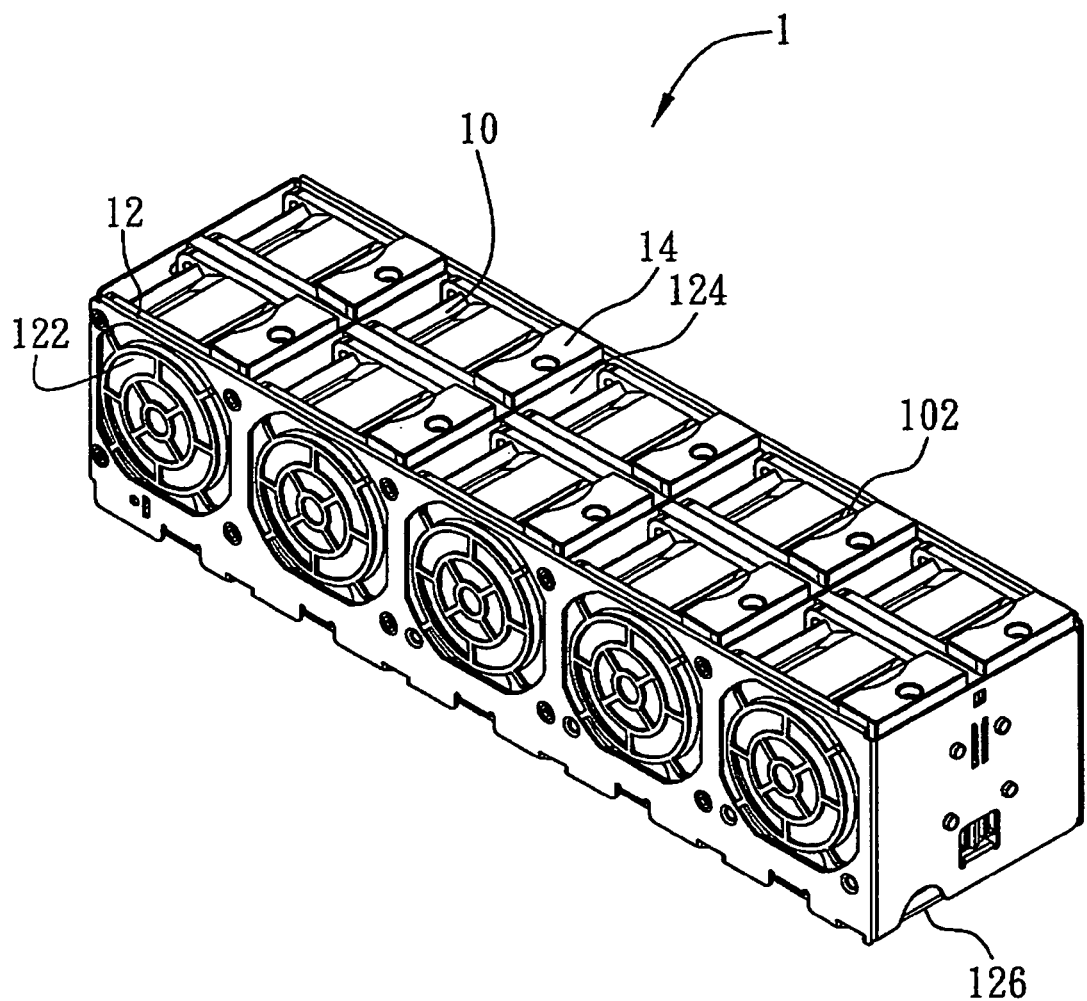
FIG. 1 is a perspective view of a fan device according to the prior art.
Figure 2:
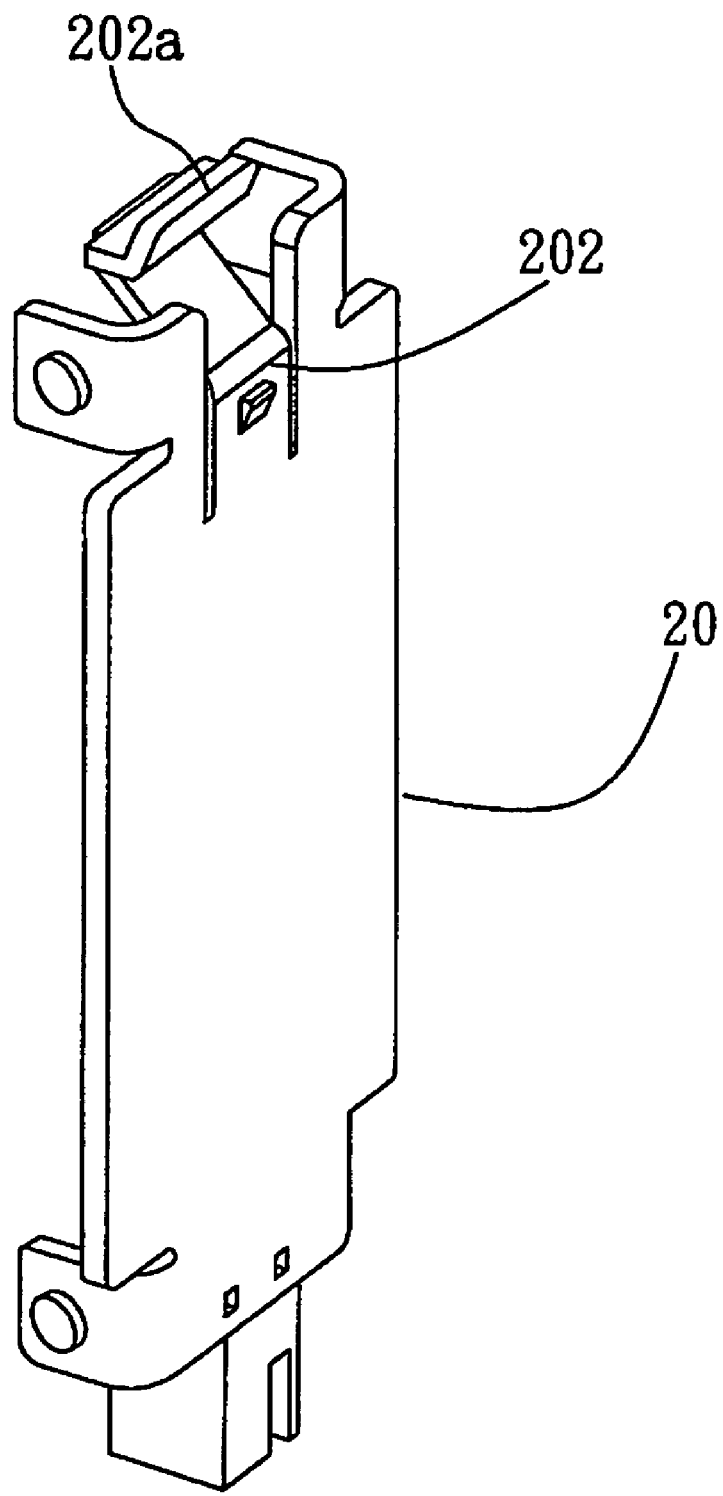
FIG. 2 is a perspective view of another fan device according to the prior art.
Figure 3:
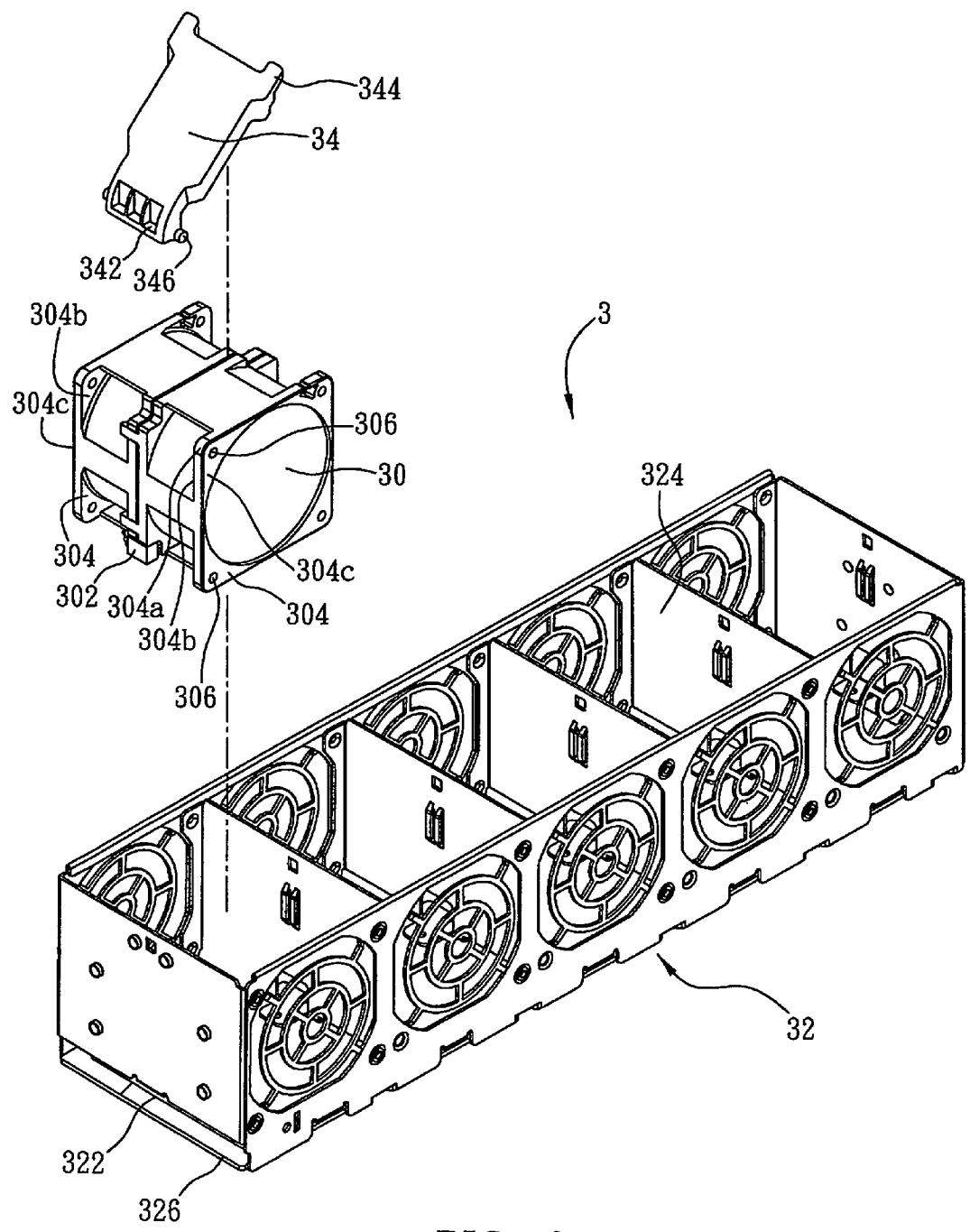
FIG. 3 is a perspective view of a fan device according to the present invention.

FIG. 3 is a perspective view of a fan device 3 according to the present invention. The fan device 3 comprises a fan body 30, a fan frame 32 and a wrench 34. Although the fan body 30 also includes other modules, such as fan blade so on. But to simplify the picture, only the relative sections relate to the present invention will be displayed in this place.

The fan body 30 has a connecting portion 302 and two side portions 304 opposed to each other. At least a corner edge 304a having an aperture 306 is installed on each of the side portions 304. According to the embodiment, the connection portion 302 is a signal connector. More specifically, the connection portion 302 is a connector for transmitting power or electrical signals. The aperture 306 intersects the corner edge 304a.

The fan frame 32 has a frame connecting end 322 for connecting with the connecting portion 302, a plurality of side walls 324 for partitioning the fan body 30. According to the embodiment, the frame connecting end 322 is a connector for transmitting power or electrical signals, and is disposed on a bottom portion 326 of the fan frame 32.

The wrench 34 has a wrench connecting end 342 and an exerting end 344 opposed to the wrench connecting end 342. Two protrusion portions 346 are disposed on two sides of the pivotally end 342 for pivotally connecting to the apertures 306 of the corner edges 304a corresponding to the fan body 30. According to the embodiment, two sides of the protrusion portions 346 are spaced at a first distance longer than a second distance between two inside walls 304b of the corner edges 304a of the fan body 30 but shorter than a third distance between two outside walls 304c of the corner edges 304a of the fan body 30.

Figure 4:
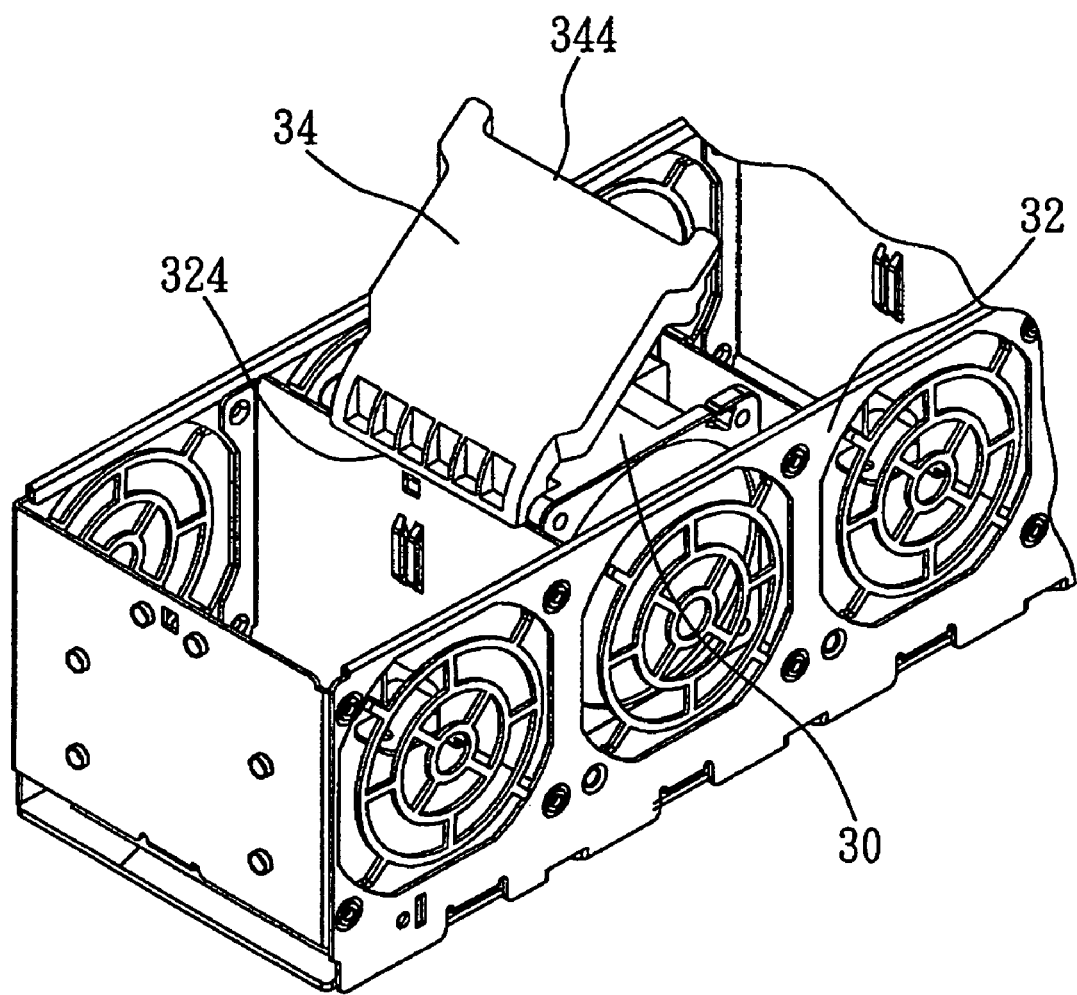
FIG. 4 is a perspective view of the fan device after assembly.

FIG. 4 is a perspective view of the fan device 3 after assembly. As shown in FIG. 4, when the fan body 30 is installed in the fan frame 32, a user is allowed to turn and abut the wrench 34 to the side wall 324 by applying a force to the exerting end 344, and take the side wall 324 as a pivot point and apply another force to the exerting end 344, to detach the fan body 30 from the fan frame 32.

Figure 5:
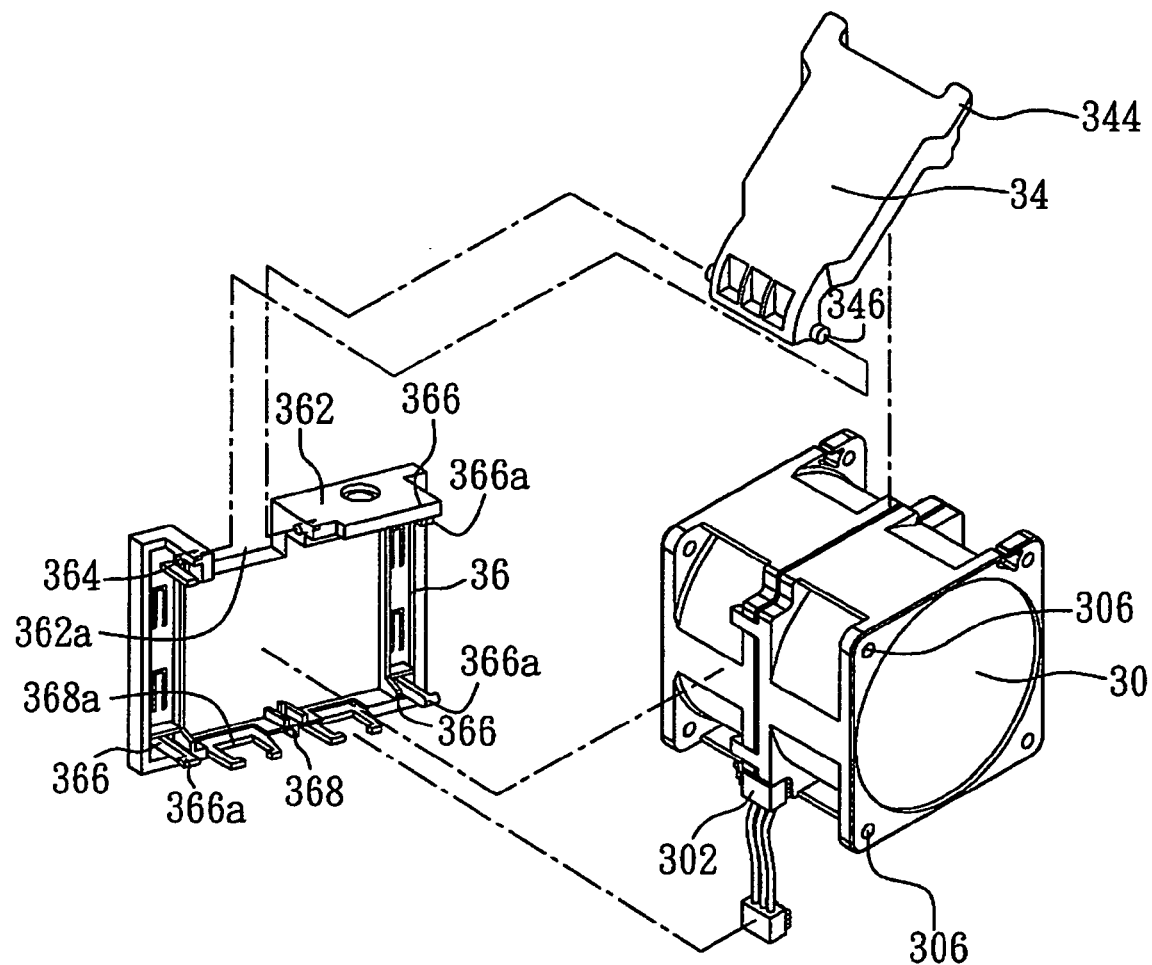
FIG. 5 is a perspective view of a fastening member of the fan device.

FIG. 5 is a perspective view of a fixing member 36 in use with the fan device 3. As shown in the FIG. 5, the fastening member 36 is used for fastening the wrench 34 on the fan device 3. The fan body 30 of this embodiment has a structure similar to that of the fan body 30 shown in FIG. 3. The only difference is the pivotally connecting structure of the fan body 30 and the wrench 34 and the fan body 30 is used for delivering power or electrical signals to the connecting portion 302. The difference will be described as the following.

The fastening member 36 comprises a top end 362 having a concave 362a. Two through holes 364 are installed on two opposing sides of the concave 362a for pivotally connecting to the two protrusion portions 346 of the wrench 34 respectively. The fastening member 36 further comprises a vertically extended coupling portion 366. The coupling portion 366 comprises a hook-shaped portion 366a for being inserted into the aperture of the fan body 30 such that the fastening member 36 can be fastened to the fan body 30. A vertically extended hold-coupling portion 368a is disposed on a bottom end 368 of the fastening member 36, for holding and fastening the connection portion 302 of the fan body 30. Therefore, the fastening member 36 can be not only engaged with the wrench 34, but also fastened to the connection portion 302 of the fan body 30, allowing the fan body 30 to be hot-swapped to the fan frame 32.

In general, a fan frame having a specified model number has its own fan body having a special connection portion. However, the fastening member 36 can fasten the connection portion 302 to a corresponding position where the connection portion 302 can be still electrically connected to the fan frame, even if the connection portion 302 is hanged down from the fan body 30. As a result, any fan bodies, as long as they have the same size, can be applied to the present invention.

Figure 6:
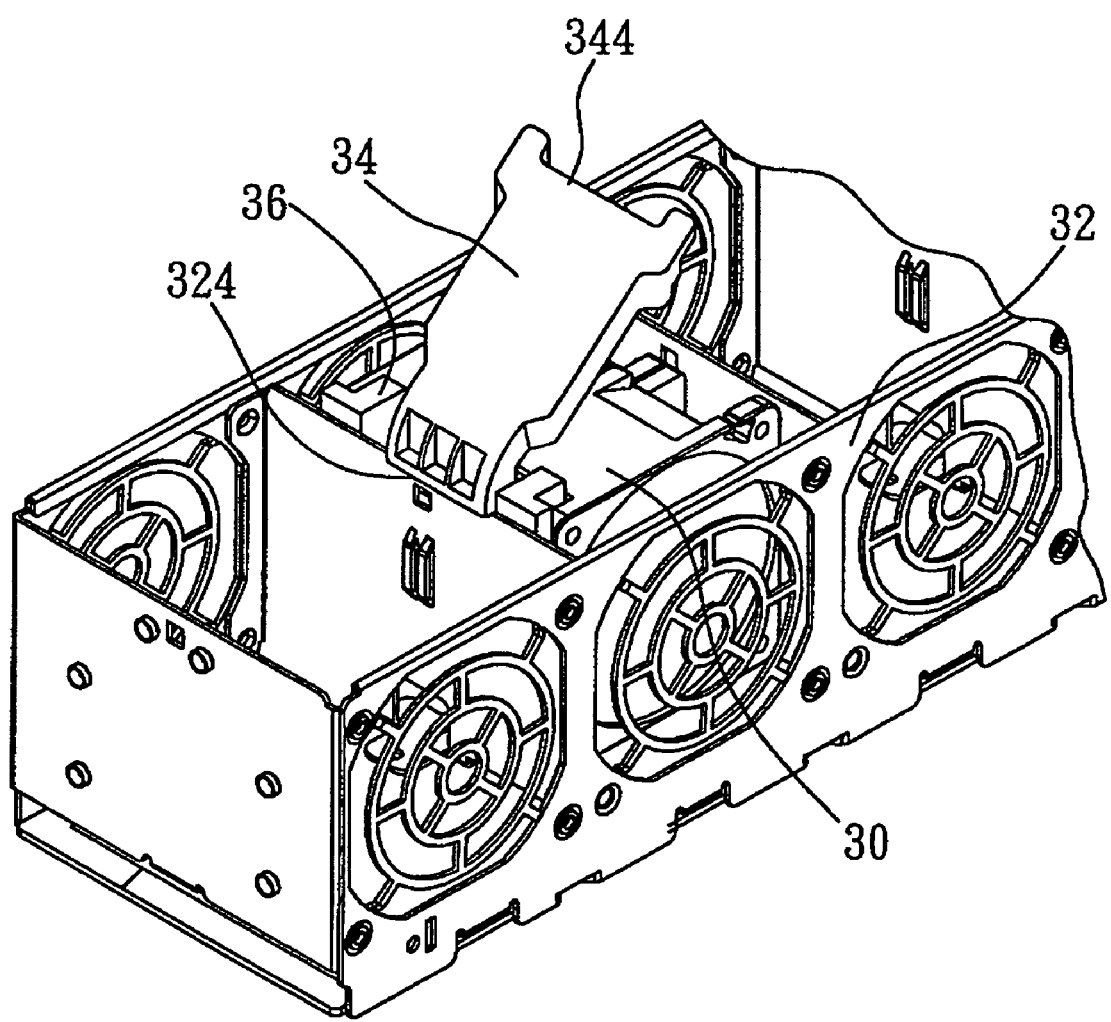
FIG. 6 is an assembly view of the fan and the securing member shown in FIG. 5.

FIG. 6 is a perspective view of the fixing member 36 assembled to the fan device 3. As shown in FIG. 6, the fan body 30 and the connecting portion 302 are fastened to the fixing member 6 and the hook-shaped portion 368a first, and the fan body 30 and the connecting portion 302 are then installed in the fan frame 32. Similarly, a user is allowed to turn and abut the wrench 34 to the side wall 324 by applying the force to the exerting end 344, and detach the fan body 30 from the fan frame 32 by applying the another force to the side wall 324 and the exerting end 344.

As aforementioned, a fan device includes a fan body, a fan frame, either the structural design of the wrench or securing member, the fan body is installing in the fan frame, the exerting end is used to exert force to turn the wrench so that is abuts against a side wall thereof, thereby exerting force on the side wall and the exerting end to detach the fan body from the fan frame more efficiently.

The above embodiments are only used to illustrate the principles of the present invention, and they should not be construed as to limit the present invention in any circumstance. The above embodiments can be modified by those ordinary skills in the arts without departing from the scope of the present invention as defined in the following appended claims.

What is claimed is:

1. A fan device comprising:
   a fan body having a connecting portion, two side portions opposed to each other, and two corner edges formed on the side portions respectively, each of the corner edges having an aperture;
   a fan frame having a frame connecting end for connecting with the connecting portion, and a sidewall for partitioning the fan body;
   a wrench having a wrench connecting end and an exerting end, two protrusion portions being disposed on two sides of the wrench connecting end;
   wherein the wrench is turned and abutted against the sidewall if a force is applied to the exerting end, and the connecting portion is detached from the frame connecting end if another force is applied to the exerting end while the side wall is taken as a pivot point; and
   further comprising a fastening member and two apertures installed on the corner edges of the fan body respectively, the fastening member having a top end having a concave, two through holes installed on two opposing sides of the concave, a vertically extended coupling portion installed on an external side of an corner edge having the through hole and having a hook-shaped portion for entering the aperture of the fan body, and a hold-coupling portion installed on a bottom end of the fastening member for holding and fastening the connecting portion of the fan body.

2. The fan device of claim 1, wherein the connecting portion is a signal connector.

3. The fan device of claim 1, wherein the connecting portion is a connector for transmitting one of power and electrical signals.

4. The fan device of claim 1, wherein the aperture intersects the corner edge.

5. The fan device of claim 1, wherein the frame connecting end is a signal connector.

6. The fan device of claim 1, wherein the frame connecting end is a connector for delivering one of power and electrical signals.

7. The fan device of claim 1, wherein the end of each protrusion portion that is remote from the wrench connecting end is spaced at a first distance longer than a second distance between two inside walls of the corner edges of the fan body but shorter than a third distance between two outside walls of the corner edges of the fan body.

* * * * *